(12) United States Patent
Chaabouni et al.

(10) Patent No.: US 8,350,363 B2
(45) Date of Patent: Jan. 8, 2013

(54) ELECTRIC VIA COMPRISING LATERAL OUTGROWTHS

(75) Inventors: Hamed Chaabouni, Grenoble (FR); Lionel Cadix, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 201 days.

(21) Appl. No.: 12/831,438

(22) Filed: Jul. 7, 2010

(65) Prior Publication Data

US 2011/0018140 A1 Jan. 27, 2011

(30) Foreign Application Priority Data

Jul. 21, 2009 (FR) .................................... 09 55056
Jun. 22, 2010 (EP) .................................... 10166937

(51) Int. Cl.
*H01L 29/40* (2006.01)

(52) U.S. Cl. . 257/621; 257/698; 257/774; 257/E23.011; 257/E23.174; 257/E21.597; 438/667; 438/700

(58) Field of Classification Search .................. 257/621, 257/698, 774, E23.011, E23.174, E21.597; 438/667, 700
See application file for complete search history.

(56) References Cited

U.S. PATENT DOCUMENTS

| | | | |
|---|---|---|---|
| 5,160,987 A | 11/1992 | Pricer | |
| 2004/0043607 A1* | 3/2004 | Farnworth et al. | 438/667 |
| 2004/0061238 A1 | 4/2004 | Sekine | |
| 2007/0023913 A1 | 2/2007 | Audet | |
| 2007/0184654 A1 | 8/2007 | Akram et al. | |

FOREIGN PATENT DOCUMENTS

| | | |
|---|---|---|
| WO | 99/25026 A1 | 5/1999 |
| WO | 2009/005462 A1 | 1/2009 |

* cited by examiner

*Primary Examiner* — Tu-Tu Ho
(74) *Attorney, Agent, or Firm* — The Noblitt Group, PLLC

(57) ABSTRACT

A via connecting the front surface of a substrate to its rear surface, this substrate including a porous region extending from at least a portion of the periphery of the via, the via including outgrowths extending in pores of the porous region.

3 Claims, 4 Drawing Sheets

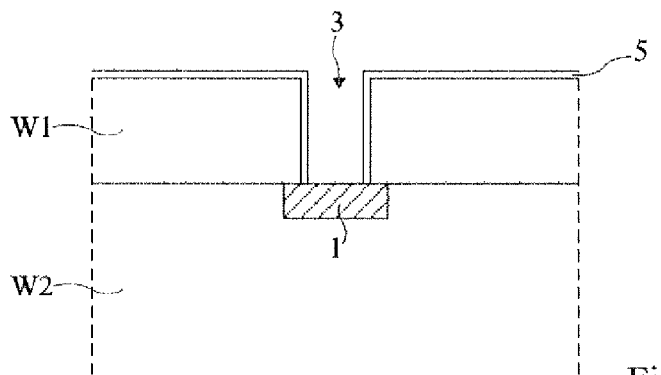
Fig 1A
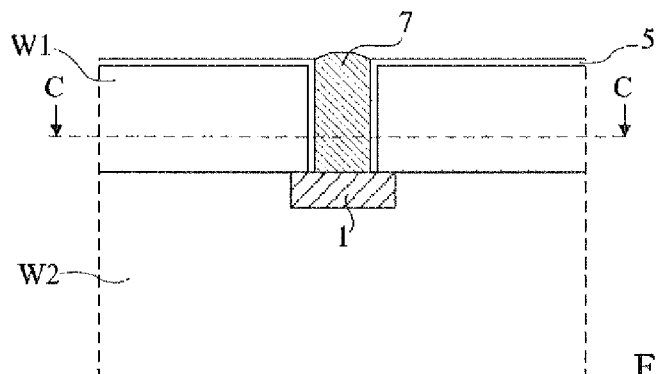 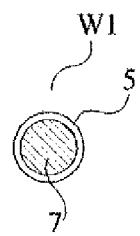
Fig 1B  Fig 1C
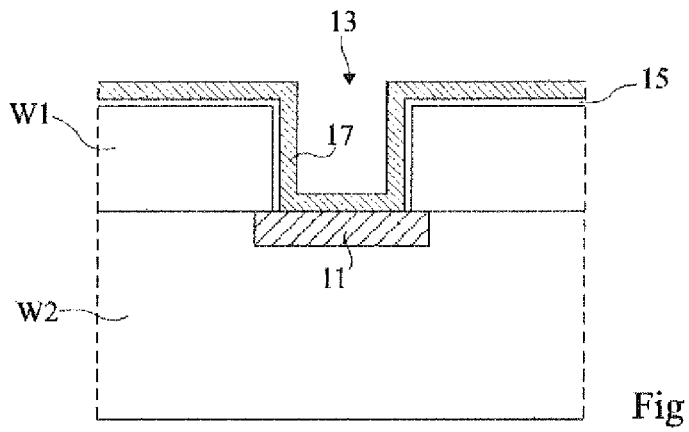
Fig 2A
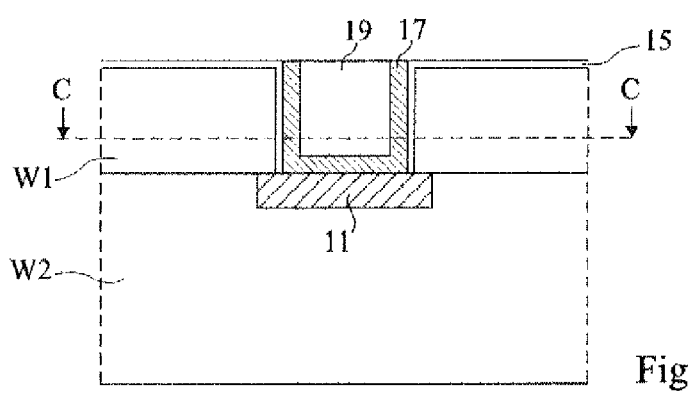 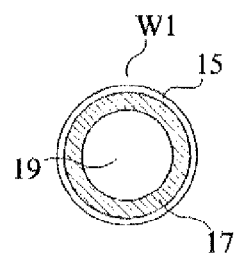
Fig 2B  Fig 2C

ELECTRIC VIA COMPRISING LATERAL OUTGROWTHS

CROSS REFERENCE TO RELATED APPLICATIONS

This application is a translation of and claims the priority benefit of French patent application Ser. No. 09/55056, filed on Jul. 21, 2009, and European patent application number 10166937 2 filed on Jun. 22, 2010, both entitled "ELECTRIC VIA COMPRISING LATERAL OUTGROWTHS," which are hereby incorporated by reference to the maximum extent allowable by law.

BACKGROUND OF THE INVENTION

1. Field of the Invention

The present invention relates to an insulated electrical connection via between the front surface and the rear surface of a substrate, currently called via in the art.

2. Discussion of the Related Art

Among the many fields of use of vias, chip stack devices may be mentioned. In such devices, it is provided to superpose semiconductor wafers or chips above one another. This enables to increase the functions carried out by a device without increasing the occupied surface area.

In such devices, the connections between components of the different stages may be formed either by conventional wiring techniques, or by vias crossing the chip substrate.

An advantage of vias is the possibility of a collective manufacturing thereof, conversely to wires which must be assembled individually. The other main advantages of vias over wires are a surface gain, and the possibility of a surface distribution of the inputs/outputs. Another advantage of the connection by vias is that such vias will currently be made in silicon wafers. The silicon wafers will then be assembled in various ways, among which that described hereafter, to be eventually diced into individual chips. Such collective methods provide cost reductions. In the present description, chip assemblies will be mentioned, but it should be clear that the chips may be wafers, semiconductor wafers or elements of semiconductor wafers.

FIGS. 1A and 1B are side cross-section views illustrating steps of a method for forming a solid via having a diameter smaller than 10 μm, for example, on the order of from 0.5 to 10 μm. FIG. 1C is a top cross-section view along plane C-C of FIG. 1B and shows a section of the formed via.

A thinned-down semiconductor wafer or chip W1 is superposed to a semiconductor wafer or chip W2. Chips W1 and W2 are for example bonded together by molecular bonding. The thinning down of chip W1 may be performed before or after the bonding. Chips W1 and W2 are each formed in a semiconductor substrate, according to conventional methods. They especially each comprise active areas, in which components are formed, and a stack of conductive interconnect tracks, for example, copper tracks, connecting the components together and to the inputs-outputs. At the surface of chip W2, on the surface side common to chips W1 and W2, a conductive contact pad 1 is provided, for example corresponding to a copper portion of an upper interconnect level. Contact pad 1 is connected to a terminal of the chip by conductive tracks, not shown, to be able to be connected to a reference voltage in a subsequent electrolytic deposition step.

A hole 3, thoroughly crossing the substrate of chip W1, is formed in front of contact pad 1. Hole 3 may be bored by dry etch or chemical etch. The walls of hole 3 are insulated, for example, by deposition of a silicon oxide layer 5. The portion of insulating layer 5 covering, at the bottom of hole 3, contact pad 1, is removed to leave access to pad 1.

The assembly thus formed is dipped into an adapted conductive electrolytic solution, for example copper sulfide. Contact pad 1 is set to a negative voltage and forms a cathode. A copper anode, connected to a positive voltage, is dipped into the electrolytic solution. A current thus flows between the anode and the cathode. Copper progressively deposits by electrolysis on the cathode, thus filling hole 3. The electrolysis is interrupted when hole 3 is full, thus forming a cylindrical conductive via 7. A planarization step may further be provided to level the surface of via 7 after the electrolysis.

For diameters greater than a few μm, the filling by electrolysis would be too long and too expensive to implement.

FIGS. 2A and 2B are side cross-section views illustrating steps of the forming of a hollow via having a diameter greater than 10 μm, for example, on the order of from 10 to 200 μm. FIG. 2C is a top cross-section via along plane C-C of FIG. 2B, and shows a cross-section of the formed via.

Semiconductor wafers or chips W1 and W2 are superposed as described hereabove. At the surface of chip W2, on the side of the surface common to chips W1 and W2, a conductive contact pad 11 is provided, for example corresponding to a copper portion of an upper interconnect level.

A hole 13 thoroughly crossing chip W1 is bored in front of pad 11. A sheath for insulating the walls of hole 13 is formed, for example, by deposition of a silicon oxide layer 15. The portion of insulating layer 15 covering contact pad 11 is removed to leave access to pad 11.

A conductive layer 17, for example, a copper layer, is formed by conformal deposition on the insulated walls and on the bottom of hole 13. Layer 17 forms a contact with pad 11 of chip W2.

The portions of layer 17 at the surface of chip W1 are removed to only keep the portion applied on the insulated walls and on the bottom of hole 13. The remaining portion of layer 17 thus forms a tubular via 17, which is ring-shaped in top view.

Via 17 is generally filled with a filling resin 19.

In operation, when vias conduct currents, they generate heat by Joule effect. This results in a rise of their temperature, which may cause damage or a decrease in the chip lifetime.

SUMMARY OF THE INVENTION

An embodiment of the present invention overcomes all or part of the disadvantages of conventional vias.

An embodiment of the present invention provides a via structure enabling to limit the temperature rise of the via when it conducts a current.

Thus, an embodiment of the present invention provides a via connecting the front surface of a substrate to the rear surface thereof, this substrate comprising a porous region extending from at least a portion of the periphery of the via, the via comprising outgrowths extending in pores of the porous region.

According to an embodiment of the present invention, the above-mentioned via is insulated from the substrate by a thin layer of an electrically-insulating material.

According to an embodiment of the present invention, the electrically-insulating material is thermally conductive.

According to an embodiment of the present invention, the porous region extends across a width ranging between 5% and 20% of the diameter of the via.

An embodiment of the present invention provides a method for manufacturing a via connecting the front surface of a substrate to the rear surface thereof, comprising the successive steps of: a) boring a hole thoroughly crossing the substrate; b) making porous a region of the substrate at the periphery of the hole; and c) filling the pores of said porous region and covering the wall of the hole with an electrically-conductive material.

According to an embodiment of the present invention, a contact pad is placed against the rear surface of the substrate in front of the hole, and at least one electrode is formed on the front surface side of the substrate, close to the hole, and step b) comprises an electrochemical anodization step, the contact pad and said at least one electrode forming separate electrolysis terminals.

According to an embodiment of the present invention, step b) further comprises a step of doping of said substrate region at the periphery of the hole before the electrochemical anodization step.

According to an embodiment of the present invention, said at least one electrode has the shape, in top view, of a ring surrounding the hole.

According to an embodiment of the present invention, step c) comprises a step of thin conformal deposition of the electrically conductive material.

According to an embodiment of the present invention, a step of filling of the hole by electrodeposition of a conductive material is provided after step c).

According to an embodiment of the present invention, a step of conformal deposition of a conductive material on the walls of the hole is provided after step c).

According to an embodiment of the present invention, a step of conformal deposition of an insulating layer is provided after step b) and before step c).

The foregoing benefits, features, and attributes of the present invention will be discussed in detail in the following non-limiting description of specific embodiments in connection with the accompanying drawings.

BRIEF DESCRIPTION OF THE DRAWINGS

FIGS. 1A and 1B, previously described, are side cross-section views illustrating steps of the forming of a solid via having a diameter smaller than 10 µm;

FIG. 1C, previously described, is a top cross-section view of FIG. 1B showing a cross-section of a solid via;

FIGS. 2A and 2B, previously described, are side cross-section views illustrating steps of the forming of a tubular via having a diameter greater than 10 µm;

FIG. 2C, previously described, is a top cross-section view of FIG. 2B showing a cross-section of a tubular via;

DETAILED DESCRIPTION

Figure 3:
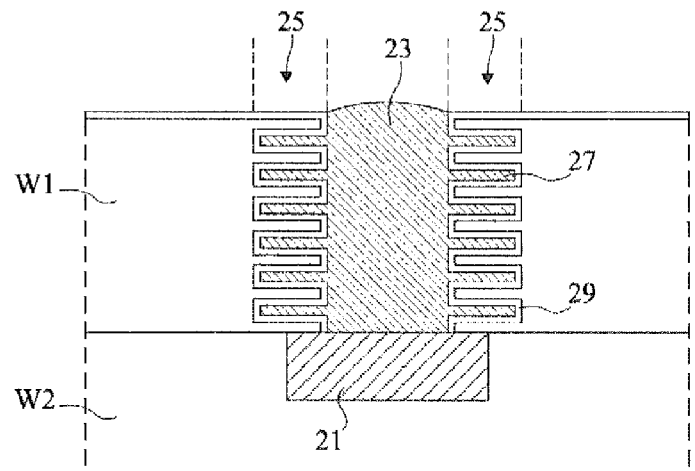
FIG. 3 is a side cross-section view very schematically showing an embodiment of a solid via having a diameter smaller than 10 µm.

For clarity, the same elements have been designated with the same reference numerals in the different drawings and, further, as usual in the representation of integrated circuits, the various drawings are not to scale.

The inventors have studied the dissipation of the heat generated in a via.

A first part of the heat propagates from the top and from the bottom of the via towards the chip interconnect tracks. However, the dissipation surface area provided by the interconnect tracks is small. Further, insulating layers, generally made of silicon oxide, are interposed between the successive interconnect levels. As a result, the heat dissipation via the interconnect tracks is low.

A second part of the heat is dissipated from the lateral external surface of the via through the insulating sheath, into the substrate bulk. However, the low thermal conductivity of the conductive sheath limits the heat dissipation in the substrate bulk.

The thermal exchanges between a via and the bulk of the substrate that it crosses are here desired to be improved to decrease the temperature rise of the via.

FIG. 3 is a side cross-section view very schematically illustrating an embodiment of a solid via having a diameter smaller than 10 µm.

A thinned-down semiconductor wafer or chip W1 is superposed to a semiconductor wafer or chip W2 in the way described in relation with FIGS. 1A and 1B. At the level of the surface common to chips W1 and W2, a conductive contact pad 21 is provided, which for example corresponds to a copper portion of an upper interconnect level of chip W2. Contact pad 21 is connected to a terminal of the chip by conductive tracks, not shown, to be able to be connected to a reference voltage during electrolysis steps, described hereafter.

A solid via 23, for example, a straight cylinder with a circular cross-section, thoroughly crosses chip W1 and forms an electric contact with pad 21 of chip W2. A porous ring 25 filled with conductive outgrowths 27 solid with via 23 extends around via 23. An example of a method for forming ring 25 will be described hereafter. An insulating layer 29, for example formed of silicon oxide, insulates via 23 and outgrowths 27 from the substrate.

The representation of via 23 given in FIG. 3 is very simplified. In particular, although outgrowths 27 have been shown as extending horizontally, rectilinearly, and identically, they are not regular in practice and extend in various directions around via 23. Further, this representation is not to scale. As an example, the length of outgrowths 27 may be on the order of from 5 to 20% of the diameter of the solid portion of via 23, for example, on the order of 0.1 µm for a via having a diameter on the order of 1 µm. The diameter of outgrowths 27 may vary from 20 nm to 500 nm according to the features of porous region 25.

An advantage of the provided embodiment is that the contact surface area between the via comprising outgrowths and the silicon oxide insulating layer is increased with respect to the case of conventional vias with a smooth lateral surface. This results in an increase of the thermal exchanges between the via and the chip substrate. This limits the temperature rise of the via and the associated damage risks.

FIGS. 4A to 4H illustrate successive steps of an example of a method for forming the via of FIG. 3.

FIGS. 4A to 4D are side cross-section views illustrating the forming of a porous ring at the periphery of a hole crossing the substrate.

Figure 4A:
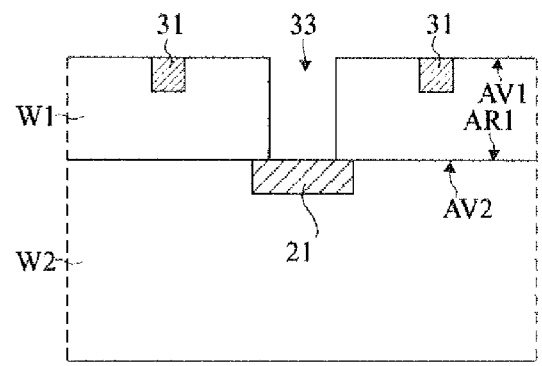
FIGS. 4A to 4H illustrate successive steps of an example of a method for forming the via of FIG. 3.
Figure 4B:
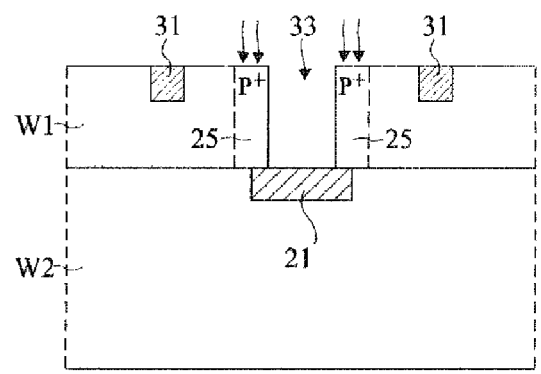
Figure 4C:
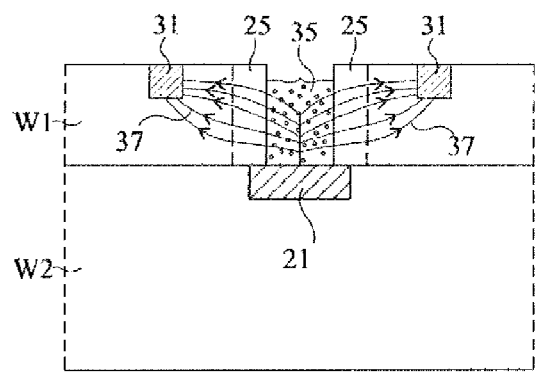
Figure 4D:
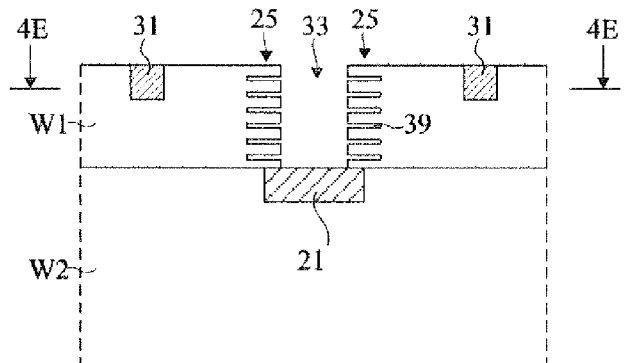
Figure 4E:
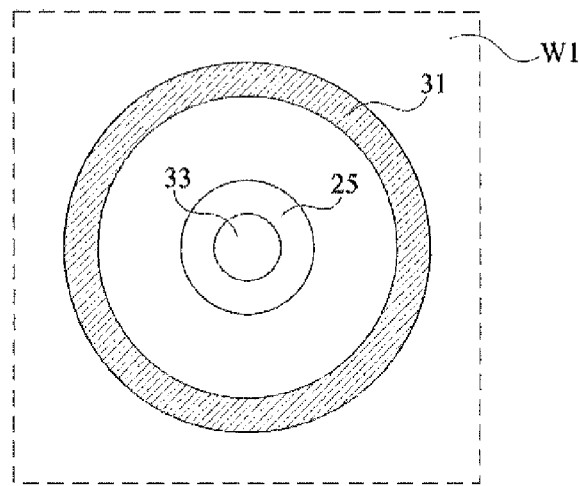

FIG. 4E is a top cross-section view along plane 4E-4E of FIG. 4D.

Figure 4F:
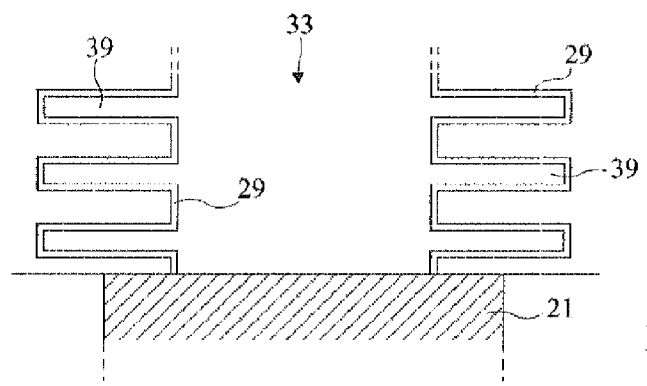
Figure 4G:
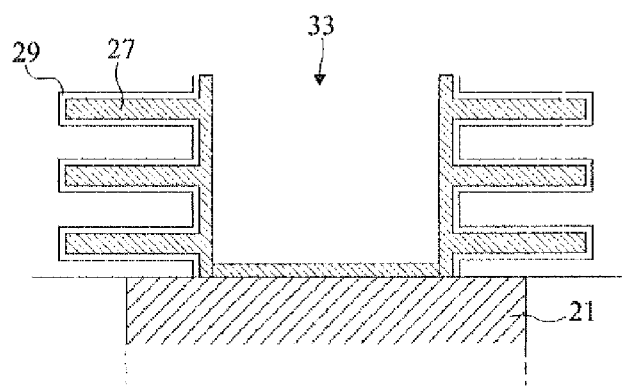
Figure 4H:
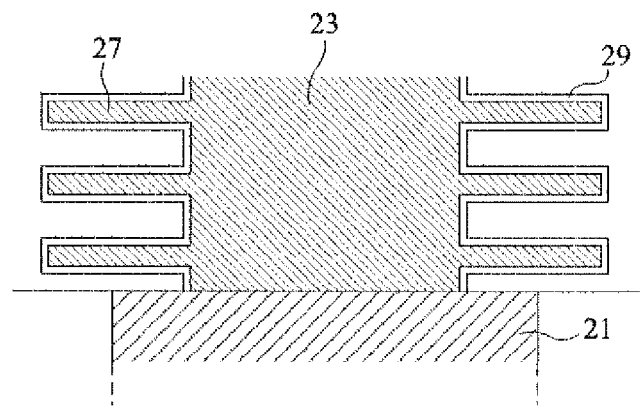

FIGS. 4F to 4H are side cross-section views, enlarged with respect to the views of FIGS. 4A to 4D, illustrating steps of insulation and filling of the porous ring and of the hole with a conductive material.

FIG. 4A shows a semiconductor wafer or chip W1 having its rear surface AR1 placed against front surface AV2 of a semi-conductor wafer or chip W2, as described in relation with FIGS. 1A and 1B. Chip W2 comprises, on its front surface side AV2, a conductive pad 21 in contact with rear surface AR1 of chip W1.

An electrode 31 is formed in the substrate of chip W1, on the side of its front surface AV1. Electrode 31 has, in this example, the shape of a ring surrounding the region in which the via is to be formed. The center of ring 31 is located vertically above contact pad 21. As an example, a ring-shaped trench is dug into the substrate, then filled with copper. A thin layer of a material capable of preventing the diffusion of copper into the silicon, for example, tantalum (Ta) or titanium nitride (TiN), may further be provided.

A hole 33 thoroughly crossing chip W1 in front of contact pad 21 is then bored. The center of hole 33 substantially coincides with the center of ring 31.

FIG. 4B illustrates a step of doping of the substrate region 25 which is desired to be made porous. In this example, a ring 25 extending from the periphery of hole 33 is heavily P-type doped, for example, by implantation of boron atoms. A selective mask, not shown, covers the surface of chip W1 during the doping step to delimit region 25. As an example, the external diameter of ring 25 may be greater by from 5 to 20% than the diameter of hole 33.

FIG. 4C illustrates an electrochemical anodization step resulting in the forming of pores in doped ring 25. Hole 33 is filled with an electrolytic solution 35 based on hydrofluoric acid. In practice, the assembly formed of chips W1 and W2 placed against each other is entirely dipped into an electrolysis bath. A potential difference is applied between contact pad 21 and electrode 31. A current then flows along lines 37 running through electrolytic solution 35 and through doped region 25. This results in the forming of pores in region 25.

FIG. 4D shows pores 39 formed in peripheral region 25 at the end of the electrochemical anodization step. The depth and the diameter of the pores especially depend on the anodization time, on the intensity of the current, and on the composition of electrolytic solution 35. Again, the pores extend irregularly at the periphery of hole 33.

FIG. 4E is a top cross-section view of FIG. 4D. Porous region 25 formed at the end of the electrochemical anodization step has the shape of a ring extending from the periphery of hole 33.

FIGS. 4F to 4H are partial enlarged view in the same cross-section plane as the representation of FIGS. 4A to 4D.

FIG. 4F illustrates the forming of an insulating layer 29 on the walls of hole 33 and of pores 39. Layer 29 may be deposited according to a thin conformal deposition, for example, of ALD type (for Atomic Layer Deposition). Any other method capable of forming a thin film on irregular surfaces, difficult to access, may be used.

FIG. 4G illustrates the forming of conductive out-growths 27 by conformal deposition of copper, for example of type ALD, in pores 39 and on the walls of hole 33.

FIG. 4H illustrates the forming of the solid portion of via 23, for example, by electrolytic deposition of the type described in relation with FIGS. 1A to 1C.

Figure 5:
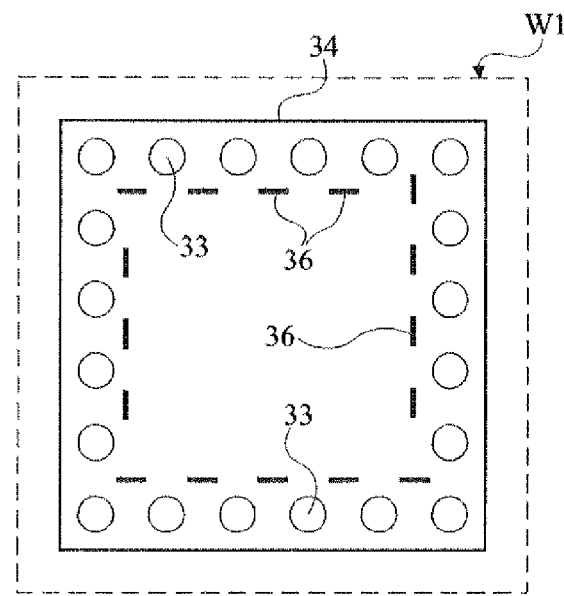
FIG. 5 is a simplified top view illustrating a variation of the method described in relation with FIGS. 4A to 4H.

FIG. 5 is a top cross-section view illustrating an alternative embodiment of the above-described method. A chip W1 is thoroughly crossed by holes 33 distributed at its periphery along rows parallel to the chip sides. A first electrochemical anodization electrode 34 extends along the periphery of the chip outside of the rows of holes 33. Other electrodes 36 are arranged on the chip towards the inside with respect to holes 33. Electrodes 34 and 36 correspond to electrode 31 of FIGS. 4D and 4E. Electrodes 34 and 36 are all connected to a same voltage. The method for forming the vias is identical to that described in relation with FIGS. 4A to 4H.

At the end of the electrochemical anodization step, the porous regions extend, from the periphery of each hole 33, towards electrodes 34 and 36. Thus, the porous regions do not form, around holes 33, rings of regular thickness, but rather discontinuous rings or rings of irregular thickness.

Embodiments of a solid via having a diameter smaller than 10 μm have been described herein. However, a hollow via having a diameter greater than a few μm, for example, on the order of from 10 to 200 μm, similar to the vias of the type described in relation with FIGS. 2A to 2C, and comprising outgrowths extending in pores of a peripheral porous substrate region on its external lateral surface, may also be formed.

Figure 6:
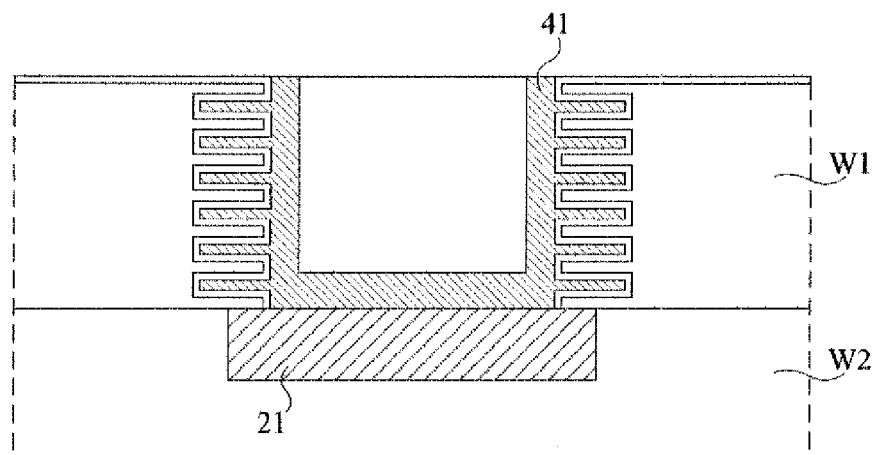
FIG. 6 is a side cross-section view very schematically showing an embodiment of a hollow via having a diameter greater than 10 µm.

FIG. 6 is a side cross-section view schematically showing such a hollow via 41. Via 41 may be formed according to a method similar to that described in relation with FIGS. 4A to 4H, but for the fact that the main portion of the via is not formed by electrolytic deposition, as described in relation with FIG. 4H, but for example by conformal deposition, according to the embodiment of a hollow via described in relation with FIGS. 2A and 2B.

Specific embodiments of the present invention have been described. Various alterations and modifications will occur to those skilled in the art. In particular, the present invention is not limited to the sole method for forming porous silicon described in relation with FIGS. 4A to 4E. Any other method capable of forming pores around the hole intended to receive the via may be used.

Further, in the case of a tubular via, to further increase the exchange surface area between the via and the substrate, a via having, in cross-section view in a plane parallel to the front and rear surface of the substrate, the shape of a festooned ring, may be provided.

Moreover, the present description mentions copper vias and interconnection tracks. However, the present invention is not limited to this specific case. It will also be within the abilities of those skilled in the art to implement the desired operation by using other conductive metals or materials, for example, heavily-doped polysilicon, to form the conductive portion of the vias.

Further, the present invention is not limited to methods for forming the conductive portion of the via by electrodeposition or by conformal deposition, such as mentioned hereabove. As an example, the conductive portion of the via may be deposited by chemical vapor deposition of polysilicon. This silicon will be heavily doped to be made conductive.

Similarly, it will be within the abilities of those skilled in the art to implement the desired operation whatever the insulating materials used to form the various insulating layers mentioned in the description. In particular, the insulating sheath of the via is useless in the case of an insulating substrate. In the case of a conductive substrate, to further improve thermal exchanges between a via and the substrate, the sheath may be formed of a material which is electrically insulating but thermally conductive.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An electrical connection via connecting the front surface of a semiconductor substrate (W1) to the rear snake thereof, the substrate comprising a porous region extending from at least a portion of the periphery of the via, the via comprising conductive outgrowths integral with the via extending in pores of the porous region, wherein the via is insulated from the substrate by a thin layer of an electrically-insulating material.

2. The via of claim 1, wherein the electrically-insulating material is thermally conductive.

3. An electrical connection via connecting the front surface of a semiconductor substrate (W1) to the rear surface thereof, the substrate comprising a porous region extending from at least a portion of the periphery of the via, the via comprising conductive outgrowths integral with the via extending in pores of the porous region, wherein the porous region extends across a width ranging between 5% and 20% of the diameter of the via.

* * * * *

UNITED STATES PATENT AND TRADEMARK OFFICE
CERTIFICATE OF CORRECTION

PATENT NO.         : 8,350,363 B2                                      Page 1 of 1
APPLICATION NO.    : 12/831438
DATED              : January 8, 2013
INVENTOR(S)        : Hamed Chaabouni et al.

It is certified that error appears in the above-identified patent and that said Letters Patent is hereby corrected as shown below:

In column 6, claim 1, line 65, please delete "snake" and insert --surface--

Signed and Sealed this
Fifth Day of March, 2013

Teresa Stanek Rea
*Acting Director of the United States Patent and Trademark Office*